(12) United States Patent
Nakagawa

(10) Patent No.: US 7,545,430 B2
(45) Date of Patent: Jun. 9, 2009

(54) MOVING MECHANISM, AND COMPACT CAMERA, GONIOMETER AND FIBERSCOPE USING THE MOVING MECHANISM

(75) Inventor: Tohru Nakagawa, Kusatsu (JP)

(73) Assignee: Panasonic Corporation, Osaka (JP)

( * ) Notice: Subject to any disclaimer, the term of this patent is extended or adjusted under 35 U.S.C. 154(b) by 810 days.

(21) Appl. No.: 10/997,404

(22) Filed: Nov. 24, 2004

(65) Prior Publication Data

US 2005/0111842 A1    May 26, 2005

(30) Foreign Application Priority Data

Nov. 25, 2003    (JP) .............................. 2003-394364

(51) Int. Cl.
  *G02B 13/16* (2006.01)
  *G02B 1/06* (2006.01)
(52) U.S. Cl. ...................................... 348/335; 359/666
(58) Field of Classification Search ................. 359/666, 359/665; 348/335
  See application file for complete search history.

(56) References Cited

U.S. PATENT DOCUMENTS 6,369,954 B1 *    4/2002    Berge et al. .................. 359/666

2005/0088754 A9 *    4/2005    Kroupenkine ................ 359/665

FOREIGN PATENT DOCUMENTS

| JP | 8-114703 | 5/1996 |
|---|---|---|
| JP | 11-133210 | 5/1999 |
| JP | 2001-519539 | 10/2001 |

\* cited by examiner

*Primary Examiner*—David L Ometz
*Assistant Examiner*—Dillon Durnford-Geszvain
(74) *Attorney, Agent, or Firm*—Hamre, Schumann, Mueller & Larson, P.C.

(57) ABSTRACT

The present invention provides a movement mechanism, in which a liquid arranged between a first structural member and a second structural member, wherein the interval between the first structural member and the second structural member is adjusted by changing the shape of the liquid due to an electrowetting effect, by applying a voltage to the liquid. Accordingly, a position movement mechanism that is easily miniaturized and that can be driven with a low voltage can be provided, and moreover, a miniature camera, for example that uses the moving mechanism also can be provided. Furthermore, the movement mechanism also can be utilized as a position movement mechanism for micro-machines.

8 Claims, 12 Drawing Sheets

MOVING MECHANISM, AND COMPACT CAMERA, GONIOMETER AND FIBERSCOPE USING THE MOVING MECHANISM

FIELD OF THE INVENTION

The present invention relates to position movement mechanisms that can be used in still cameras, video cameras and cameras for mobile phones, for example, and to compact cameras that use the movement mechanism.

BACKGROUND OF THE INVENTION

Still cameras, video cameras and cameras for mobile phones, for example, are designed to pass an image of an object to be photographed through a lens, to project it onto imaging elements such as solid-state imaging elements or charged coupled devices (CCD), or complementary metal-oxide semiconductor (CMOS) integrated circuits. In order to project a focused image onto the imaging elements, it is necessary to adjust the distance between the lens and the imaging element, in accordance with the distance between the lens and the object to be photographed.

In still cameras and video cameras, in order to focus, the distance between the lens and the imaging element is adjusted by mechanically moving the lens using a small motor, for example. By comparison, it is difficult to provide micro cameras mounted in mobile phones with a mechanical mechanism so as to move the lens, due to space restraints. Therefore, wide angle lenses that have a large focal depth are used to eliminate the need for focusing. However, even on cameras for mobile phones, there is a demand for a function for photographing objects not only at a large distance, but also at a distance that is on the order of a few centimeters. Such a function cannot be satisfied by current wide angle lenses, and thus there is a need for a focusing mechanism for small cameras.

There are many methods for moving a lens without using a motor, and of these, a method that utilizes piezo-electric elements is both simple and capable of miniaturization. When an electric field is applied to a piezo-electric member in a predetermined direction, the electric dipole moment of the piezo-electric member changes, and the piezo-electric member expands and contracts accordingly. This expansion and contraction can be utilized to move a lens.

In addition to this, a focusing method in which the lens shape is deformed to change the focal length, has been proposed.

In JP H8-114703A, a lens is described in which at least one side of the lens is provided with a pressure chamber, constituted by a transparent elastic film, into which operating oil is sealed, and in which the focal length can be controlled by deforming the transparent elastic film through pressure generated by the operating fluid acting on the transparent elastic film. In this lens, while the deformed shape of the transparent elastic film is optimized so as to minimize generation of lens aberration, the pressure of the operating oil within the pressure chamber is measured with a pressure sensor that is formed from the transparent elastic film, and thus by controlling the pressure of the operating oil according to the measured value, it is also possible to suppress changes in the focal length due to expansion and contraction of the operating oil.

In JP H11-133210A, a variable focus lens is described wherein an electric potential applied between a first electrode and a conductive elastic plate generates suction force due to coulomb's force, narrowing the interval between the two bodies, and as a result, the volume of transparent liquid expelled from the interval between the two is used to protrude convexly and deform a central portion of the transparent elastic plate with the transparent liquid at its back.

In Tokuhyo 2001-519539, a variable focus lens that uses the electro-wetting effect has been proposed. A water-repellant transparent insulating film is formed on a transparent electrode, and by arranging a liquid droplet on that, the liquid droplet is used as the lens. When a voltage is applied between a lower electrode and the liquid droplet, an electric charge is generated at the liquid/insulating film interface, and the shape of the liquid droplet is changed due to a reduction in the interfacial tension between the liquid/insulating film. A lens whose focal length is variable is realized by this change.

For a method for moving a lens using a piezo-electric member, the structure is simple so the size can be reduced. For example, if an electric field is applied between two faces of a ferro-electric member that has been processed into a sheet, if the electric dipole moment of the piezo-electric member is perpendicular to this surface, then the piezo-electric member will expand and contract in the direction of this surface. For example, using $LiNbO_3$ as a ferro-electric member, if the sheet thickness is 0.1 mm, and the sheet has an area that is 10 mm wide by 10 mm long, then in order to contract the sheet 2 μm in the direction of the surface, it is necessary to apply a voltage of close to 1000 V. By properly designing the ferro-electric member whose piezo-electric constant is high, and the shape thereof, it is possible to lower the applied voltage to a certain degree, but it is generally necessary to apply a voltage of several hundred volts to the piezo-electric member. It is very difficult to apply this kind of voltage in a device such as a mobile phone.

In the methods of JP H8-114703A, JP H11-133210A and Tokuhyo 2001-519539, the voltage that is applied can be smaller than when using a piezo-electric body. However, in such methods it is difficult to control the shape of the lens accurately, and it is difficult to form clean images that have no distortion. Furthermore, in Tokuhyo 2001-519539, the shape of the lens is spherical due to the surface tension of the liquid. In order to take sharper images, it is necessary that the lens shape is a non-spherical hyperbolic curve-shape, but this is problematic in the method of Tokuhyo 2001-519539.

SUMMARY OF THE INVENTION

It is an object of the present invention to provide a movement mechanism that is both easily miniaturized and can be driven by a small voltage, not for changing the shape of a lens, but for adjusting the distance between the lens, and an imaging element in order to focus a camera. Moreover, it is another object of the present invention to provide a miniature camera that uses the movement mechanism thereof.

The movement mechanism of the present invention provides a liquid arranged between a first structural member and a second structural member, wherein the interval between the first structural member and the second structural member is adjusted by changing the shape of the liquid through the electro-wetting effect, by applying a voltage to the liquid.

In another movement mechanism of the present invention, a liquid is arranged in a gap between a first structural member and a second structural member, and the first structural member and the second structural member both contact the liquid. A face of the first structural member on the side that is in contact with the liquid includes a first electrode, an insulating film that is formed on the first electrode and a first water-repelling film that is formed on the insulating film. A second electrode is formed on a face of the second structural member that is in contact with the liquid, and a second water-repelling film is formed on the periphery of the second electrode, and the liquid is in contact with both the second electrode and the second water-repelling film. This movement mechanism of the present invention provides means for applying a voltage between the first electrode and the second electrode.

A camera of the present invention provides a liquid arranged between a first structural member and a second structural member, wherein the distance between an imaging element and a lens is adjusted through a movement mechanism that adjusts the interval between the first structural member and the second structural member by changing the shape of the liquid due to the electro-wetting effect through application of a voltage to the liquid.

A goniometer of the present invention provides a liquid arranged between a first structural member and a second structural member, wherein a movement mechanism that adjusts the interval between the first structural member and the second structural member by changing the shape of the liquid due to the electro-wetting effect through application of a voltage to the liquid is used.

A fiberscope of the present invention provides a liquid arranged between a first structural member and a second structural member, wherein the direction of an imaging element is adjusted through a movement mechanism that adjusts the interval between the first structural member and the second structural member by changing the shape of the liquid due to the electro-wetting effect through application of a voltage to the liquid.

BRIEF DESCRIPTION OF THE DRAWINGS

FIG. 7 is a schematic view showing the manner in which a liquid is dripped onto a water-repelling film, according to an embodiment of the present invention, wherein

FIG. 8 is a schematic view showing the state of the liquid according to an embodiment of the present invention, wherein FIG. 8A is a schematic view of a convex-shaped liquid, which is sandwiched between two flat plates, and wherein

FIG. 10 is a schematic view of a liquid that is sandwiched between two flat plates, according to an embodiment of the present invention, wherein

FIG. 11 is a schematic view of a liquid that is in simultaneous contact with a water-repelling region and a hydrophilic region, according to an embodiment of the present invention, wherein

FIG. 14 is a schematic view showing a position movement mechanism according to an embodiment of the present invention, wherein FIG. 14A schematically shows the position movement mechanism according to the present invention and wherein

DETAILED DESCRIPTION OF THE INVENTION

The inventors of the present invention have found that by using the electro-wetting effect, it is possible to realize a positional movement mechanism that is both simply miniaturized and can be driven with a low voltage. And, they have found that if this movement mechanism is utilized, then it is possible to realize a small camera whose focus can be controlled accurately.

The "electro-wetting effect" in the present invention means the effect in which, by changing the electric charge density in the vicinity of a substrate surface that contacts a liquid, the interfacial tension between the liquid and the substrate surface changes, and as a result there is a change in wettability between the liquid and the substrate surface.

Figure 7A:
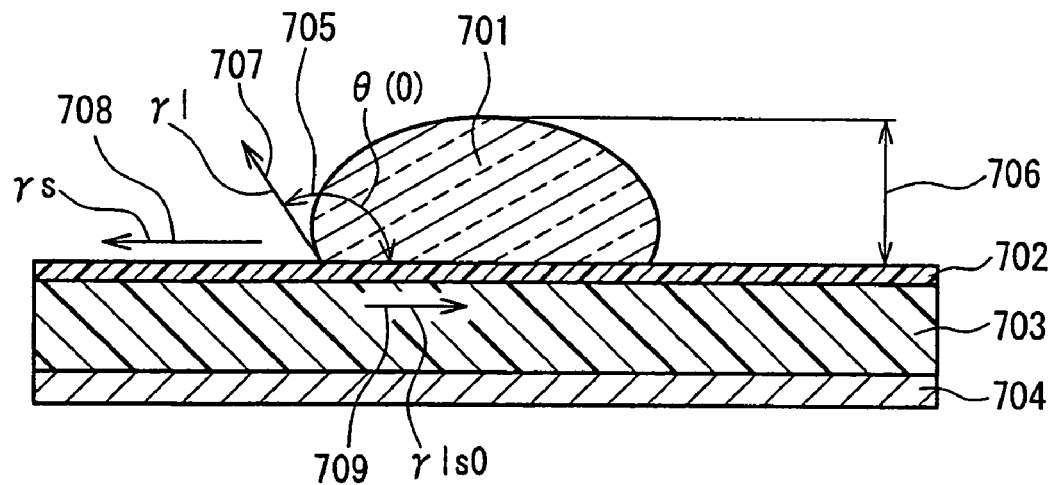
FIG. 7A is a schematic view showing the manner in which a liquid is dripped onto the water-repelling film.
Figure 7B:
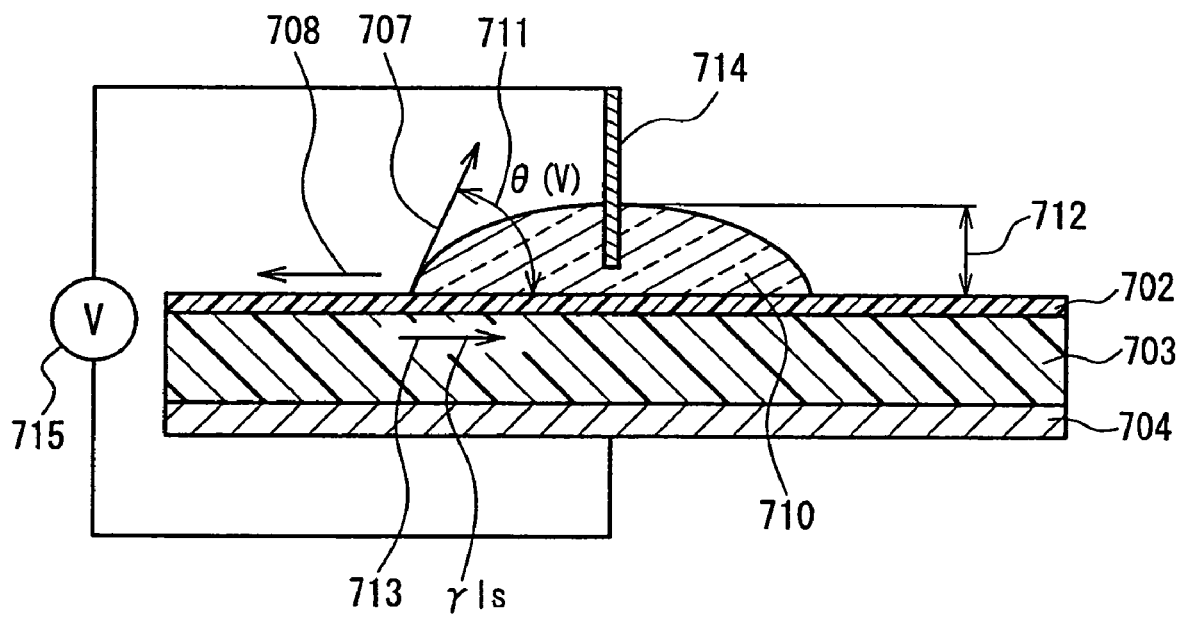
FIG. 7B is a schematic view showing the manner in which the shape of the liquid changes due to the electro-wetting effect.

First, the electro-wetting effect will be described using FIGS. 7A and 7B. In FIGS. 7A and 7B, numeral 701 denotes a liquid, numeral 702 denotes a water-repelling film, numeral 703 denotes a substrate, numeral 704 denotes an electrode, numeral 705 denotes a contact angle when no voltage is applied, numerals 706 and 712 denote heights of a liquid droplet, numeral 707 denotes a vector showing the surface tension of the liquid, numeral 708 denotes a vector showing the surface energy of the water-repelling film, numeral 709 denotes a vector showing the interfacial tension between the liquid and the water-repelling film, numeral 711 denotes a contact angle of the liquid when a voltage is applied, numeral 713 denotes an interfacial tension when a voltage is applied, numeral 714 denotes a platinum wire and numeral 715 denotes voltage application means.

As shown in FIG. 7A, when a liquid droplet is placed on the lower electrode/insulating film/water-repelling film, the liquid droplet has a contact angle θ that is shown in Young's equation (1) given below.

$$\gamma s = \gamma l \cos \theta + \gamma ls O \quad (1)$$

(where γs is the surface tension of the water-repelling film, γl is the surface tension of the liquid and γlsO is the interfacial tension between the liquid and the water-repelling film.)

Inserting a fine electrode wire into the liquid as shown in FIG. 7B, when a voltage V is applied between the electrode wire and the lower electrode, an electric charge is generated at the interface between the liquid and the water-repelling film, and the interfacial tension of the liquid and the water-repelling film is lowered due to this electric charge.

The following equation (2) applies when C is a capacitor capacitance per unit of area formed by the insulating film and the water-repelling film, and V is the applied voltage.

$$\gamma ls = \gamma ls O - \tfrac{1}{2} \times C \times V^2 \quad (2)$$

(where γlsO us the interfacial tension when V=0.)

The following formula (3) can be derived from formulas (1) and (2).

$$\cos \theta(V) = \cos \theta(0) + \tfrac{1}{2} \times C \times V^2 \quad (3)$$

(where cos θ (V) is cos θ at voltage V and cos θ (0) is cos θ when V=0).

Consequently, as shown in FIG. 7B, θ decreases by application of a voltage. Thus, the contact area between the liquid and the water-repelling film increases, and the height of the liquid surface decreases.

Figure 8A:
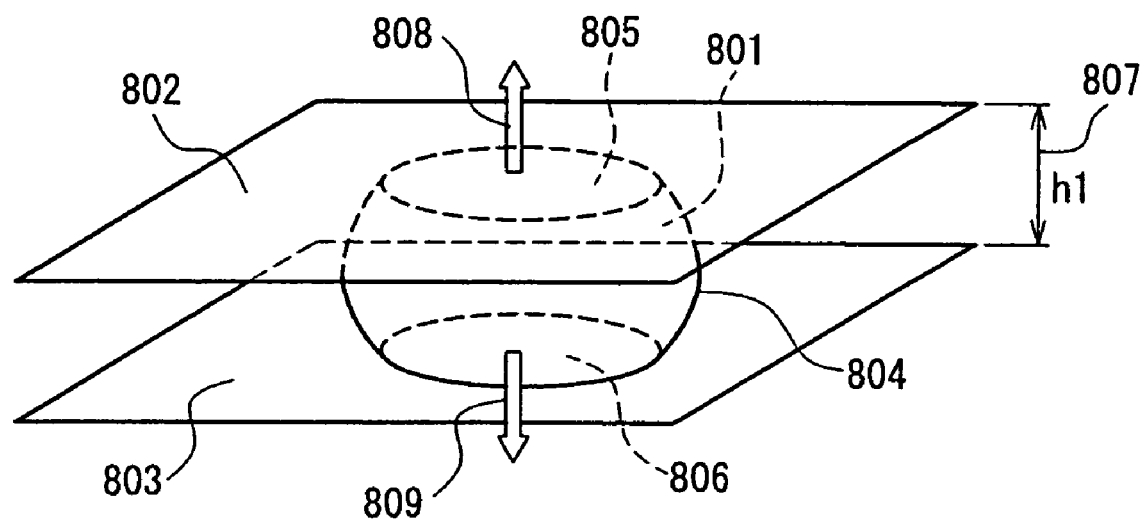
Figure 8B:
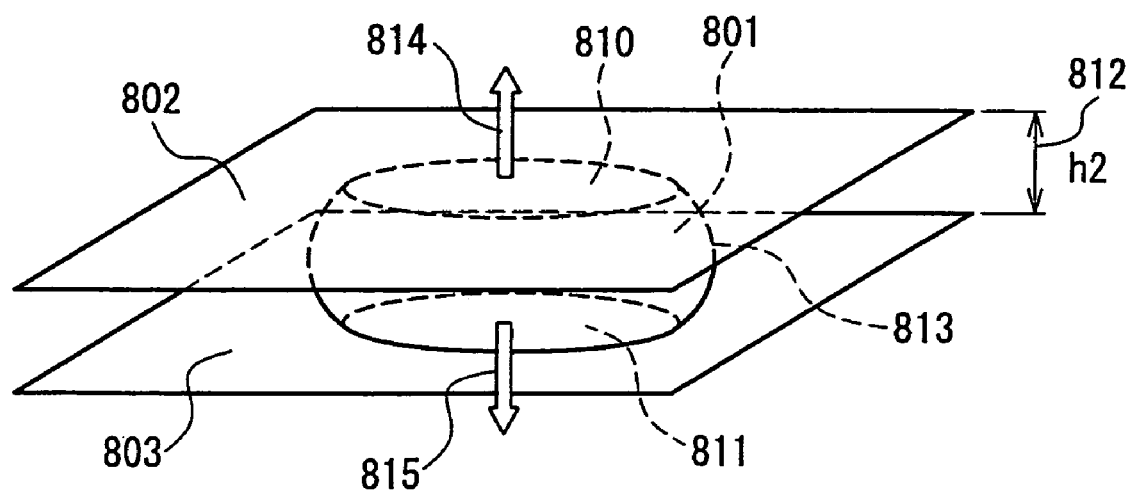
FIG. 8B is a schematic view of the liquid, whose shape is changed due to the electro-wetting effect, which is sandwiched between the two flat plates.

FIG. 8A is a schematic view of a convex-shaped liquid that is sandwiched between two flat plates, and FIG. 8B is a schematic view showing the liquid whose shape has changed due to the electro-wetting effect, that is sandwiched between two flat plates. In FIGS. 8A and 8B, numeral 801 denotes a liquid that is sandwiched between two flat plates, numerals 805, 806, 810 and 811 denote contact regions between the plates and the liquid, numerals 804 and 813 denote convex shapes, numerals 807 and 812 denote intervals between the two flat plates, and numerals 808, 809, 814 and 815 denote reaction forces that the plates receive from the liquid.

FIG. 8A is a schematic view that shows the manner in which the liquid is sandwiched between the two flat plates. The lower flat plate is fixed so that it cannot move, and gravity is acting in the downward direction of the paper surface. A form 804 (referred to below as the form of the liquid) of the part of the liquid that is not in contact with the surfaces is a convex shape. At this time, the internal pressure of the liquid is higher than the external pressure by ΔP. Consequently, the liquid exerts a pressure of ΔP with respect to the plate surface. ΔP is determined from the Young-Laplace equation (4) shown below.

$$\Delta P = 2\gamma l / RO \quad (4)$$

(where γl is the surface tension of the liquid, and RO is the radius of curvature of the liquid.)

When the contact area between the upper flat plate and the liquid is S, the plate receives a reactive force of 2 γl/RO×S in the upward direction. The upper plate is balanced between the force from the liquid and gravity, and thus the two flat plates are maintained at a predetermined interval.

Here, a case is considered in which the contact angle between the liquid and the two flat plates is reduced by utilizing the electro-wetting effect. FIG. 8B is a schematic view of the case in which the contact angle of the liquid of FIG. 8A is reduced by the electro-wetting effect. When the contact angle is reduced, the liquid spreads and the height of the liquid is reduced, and thus the interval between the two faces becomes smaller. Thus, the contact area between the liquid and each face increases, as does the radius of curvature of the liquid.

At this time, the force that acts upwards on the upper flat plate is equal to 2γl/R1×S'. R1 is the radius of curvature of the liquid, and S' is the contact area of the liquid with the upper plate. The two faces are maintained at a predetermined interval by the repulsive force and gravity. Consequently, it is possible to adjust the interval between the two faces by utilizing the electro-wetting effect.

The present invention can provide a position movement mechanism that is both easily miniaturized and which can be driven by a low voltage, and moreover, can provide a compact camera that uses this position movement mechanism. Furthermore, the movement mechanism can also be utilized as a position movement mechanism for micro-machines.

Position Movement Mechanism 1

Figure 1:
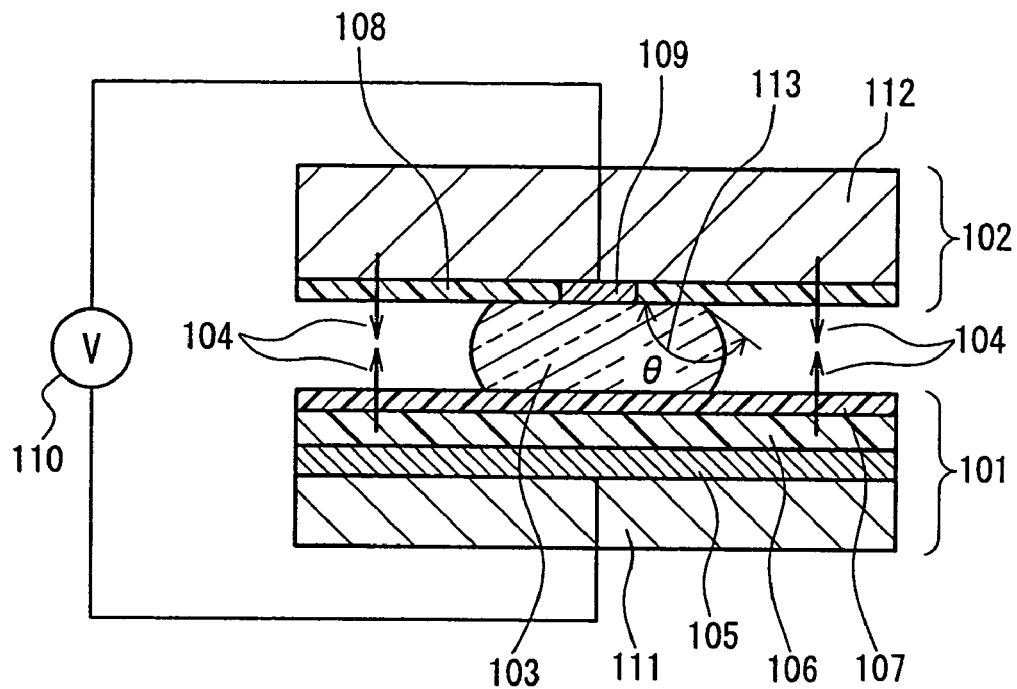
FIG. 1 is schematic view showing a cross-section of a position movement mechanism of an embodiment of the present invention.

In FIG. 1, numeral 101 denotes a first structural member, numeral 102 denotes a second structural member, numeral 111 denotes a substrate of the first structural member, numeral 112 denotes a substrate of the second structural member, numeral 103 is a liquid, numeral 107 denotes a first water-repelling film, numeral 108 denotes a second water-repelling film, numeral 106 denotes an insulating film, numeral 105 denotes a first electrode, numeral 109 denotes a second electrode and numeral 110 denotes means for applying a voltage between the first electrode and the second electrode.

As shown in FIG. 1, the liquid 103 is arranged in the gap between the first structural member 101 and the second structural member 102, and both the first structural member and the second structural member are in contact with the liquid. A binding force 104 acts on the first structural member and the second structural member such that they cannot come apart from each other. This is due to the surface tension of the liquid. The face of the first structural member on the side that is in contact with the liquid is made from the first electrode 105, the insulating film 106 that is formed on the first electrode and the first water-repelling film 107 that is formed on the insulating film. On the face of the second structural member on the side that is in contact with the liquid, the second electrode 109 is arranged such that the second water-repelling film 108 is formed around it. The liquid is in contact with both the second electrode and the second water-repelling layer. By applying a voltage to the first electrode and the second electrode, a change in the voltage thereof generates the electro-wetting effect, and the interval between the faces of the first structural member and the second structural member is adjusted by changing the shape of the liquid.

As shown in FIG. 1, the liquid 103 is always in contact with the water-repelling film 108 at the periphery of the second electrode 109. Even if a voltage is applied between the first electrode and the second electrode, a charge is never created at the interface between the second water-repelling film and the liquid, and thus a static contact angle θ 113 is maintained continuously between the second water-repelling film and the liquid. Particularly, if θ is at least 90°, the liquid is always convex-shaped, the internal pressure of the liquid is higher than the external atmospheric pressure, and a reaction force is generated in a direction so as to widen the interval between the first structural body and the second structural body. The reaction force is balanced with the binding force 104 that acts on the two structural members, and the interval between the two structural members is maintained. When a voltage is applied between the first electrode and the second electrode, the liquid on the first water-repelling film spreads due to the electro-wetting effect, and the height of the liquid changes, thus reducing the interval between the two structural members. Accordingly, it is possible to control the interval between the two structural members by adjusting the voltage that is applied. In the present invention, it is preferable that the static angle θ of the liquid with respect to the second water-repelling film is in the range of at least 90° and at most 150°. When the static angle θ is less than 90°, the liquid spreads and there is a reduction in function for widening the interval between the first structural body and the second structural body.

Position Movement Mechanism 2

A preferred embodiment of the present invention provides the movement mechanism 1 in which a filler liquid that does not mix with the liquid fills the space between the first structural member and the second structural member, wherein the filler liquid is concave, and wherein a binding force is generated by the surface tension of the filler liquid.

Figure 2:
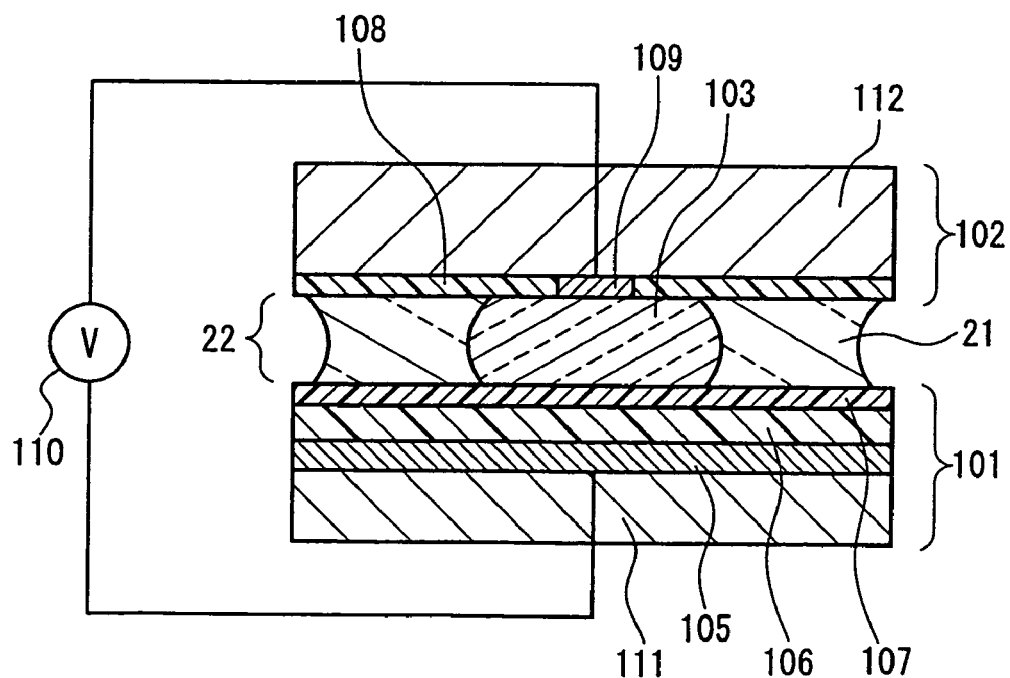
FIG. 2 is a schematic view showing a cross-section of a position movement mechanism of an embodiment of the present invention.

FIG. 2 is a schematic view of an example of the position movement mechanism of the present invention. The space between the first structural member 101 and the second structural member 102 is filled with a filler liquid 21, and a liquid surface shape 22 of the filler liquid 21 (referred to below as the shape of the liquid) that is not in contact with the two structural members and the liquid 103, is concave. This concave-shaped filler liquid provides the binding force between the two structural members. Other symbols are the same as shown in FIG. 1, so are hereby omitted.

Figure 9:
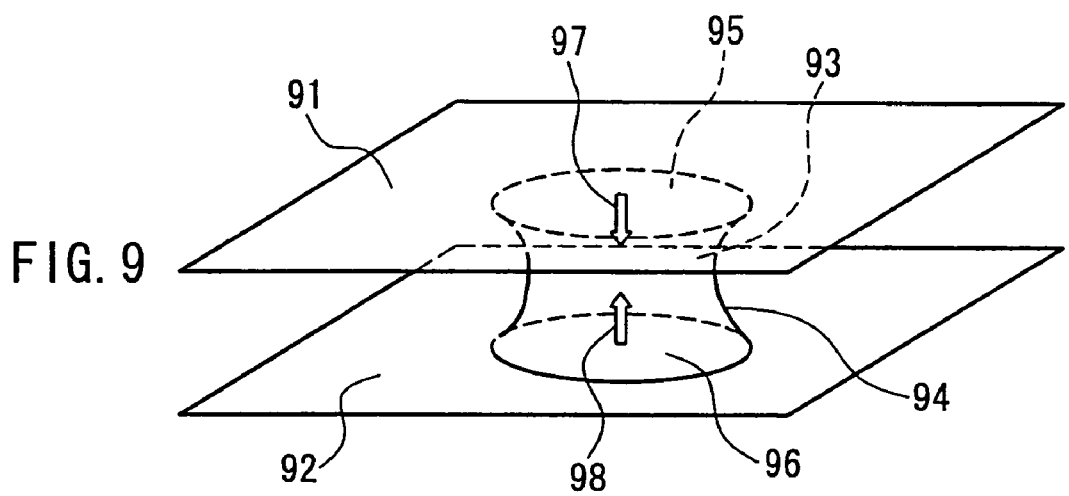
FIG. 9 is a schematic view of a concave-shaped liquid that is sandwiched between two flat plates, according to an embodiment of the present invention.

Using FIG. 9, a mechanism for generating a binding force when the filler liquid is concave-shaped is shown. There are two flat plates 91 and 92 sandwiching the liquid, and if the liquid is concave, then the liquid has an underpressure of ΔP' with respect to external pressure, and a pressure acts to bring the two faces closer. ΔP' can be determined in the same manner as with equation (4).

$$\Delta P' = 2\gamma l / Rx \quad (5)$$

(where γl is the surface tension of the liquid and Rx is the radius of curvature of the liquid face).

Consequently, when the contact area between the flat plate and the liquid is Sx, the flat plate is pulled by a force ΔP'×Sx. It should be noted that numeral 93 denotes a liquid that is sandwiched between the two flat plates, numeral 94 denotes a concave shape, numerals 95 and 96 denote contact areas between the plates and the liquid and numerals 97 and 98 denote tensile forces that the plates receive from the liquid.

According to the present invention, since a binding force is generated by the filler liquid, the binding force generating mechanism is simplified, and it is possible to reduce the size of the position movement mechanism.

Position Movement Mechanism 3

In a more preferable position movement mechanism of the present invention, the position movement mechanism 1 further is provided with a hydrophilic region in which the water-repelling film is not formed, provided on the insulating member of the first structural member wherein the liquid is in contact with the hydrophilic region.

Figure 3:
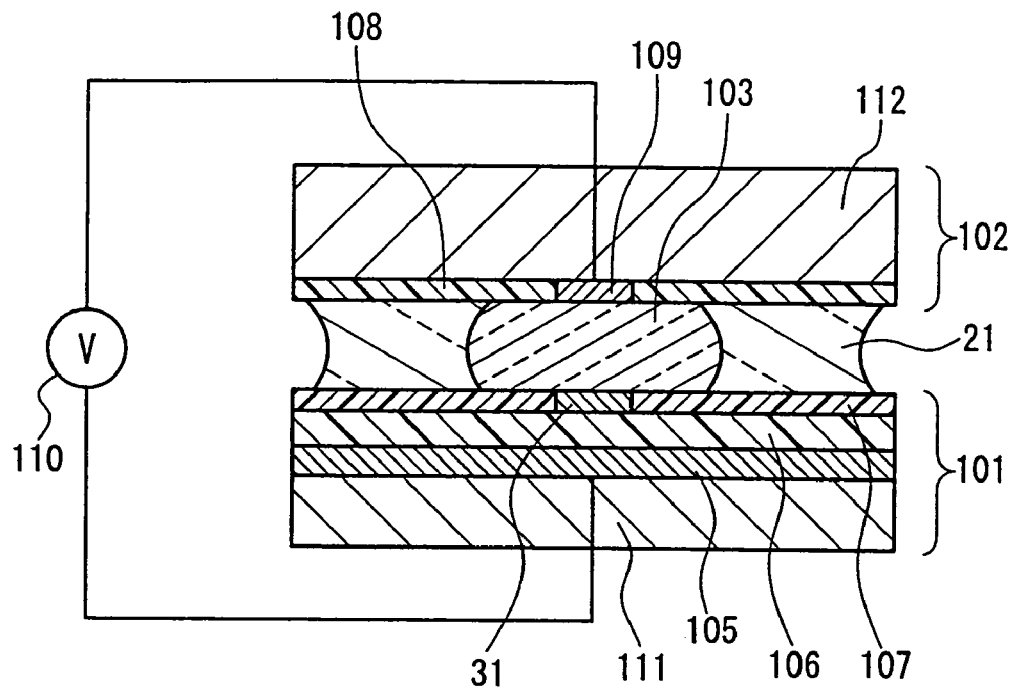
FIG. 3 is a schematic view showing a cross-section of a position movement mechanism of an embodiment of the present invention.

FIG. 3 shows a schematic view of an example of the position movement mechanism. In this position movement mechanism, the liquid 103 is always in a position centered on a position 31 that is hydrophilic, and thus it is possible to control the position of the two structural members with favorable reproducibility.

Figure 10A:
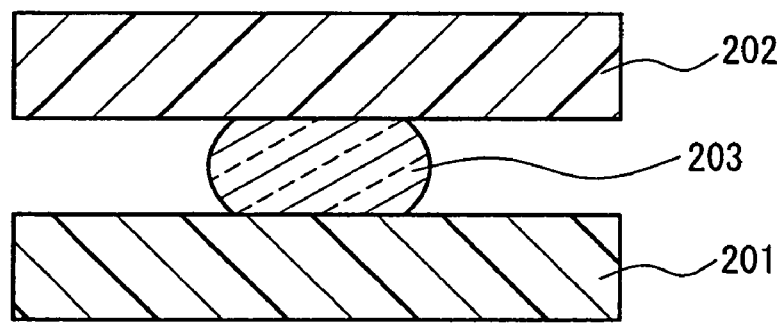
FIG. 10A and FIG. 10B show examples in which the position of the liquid differs.
Figure 10B:
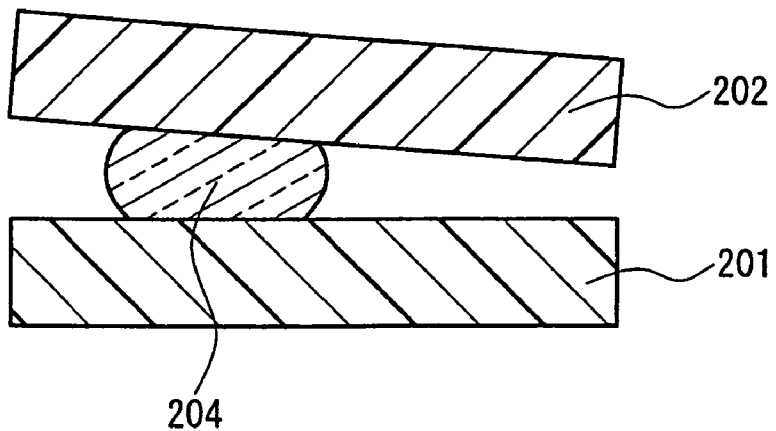
Figure 11A:
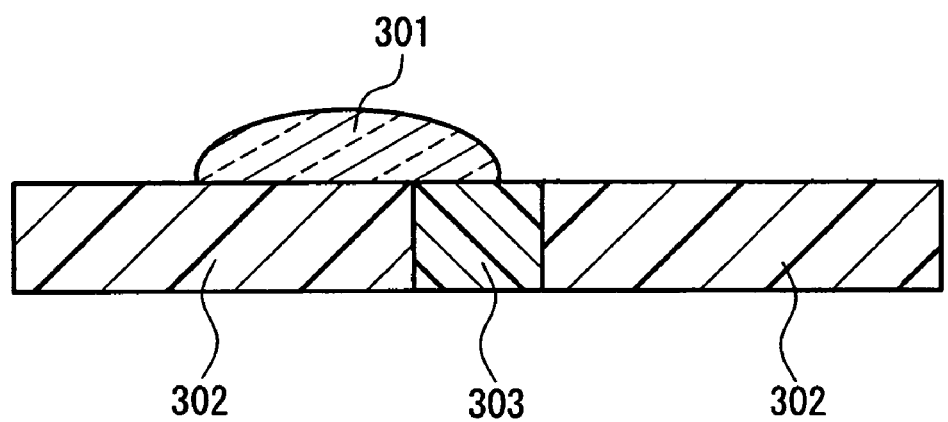
FIG. 11A shows the initial condition.
Figure 11B:
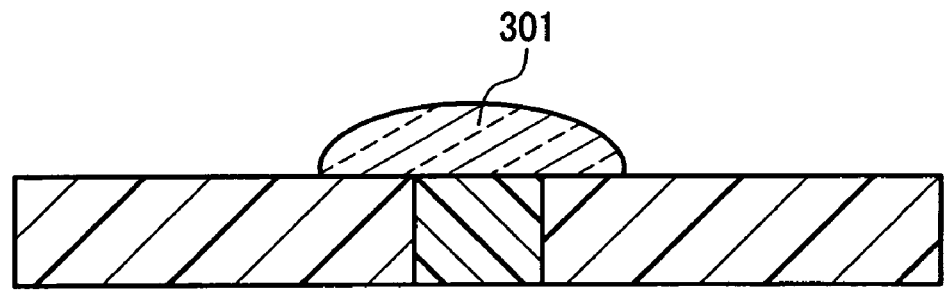
FIG. 11B shows a stable energy condition.

Generally, the position of liquids in contact with water-repelling regions is easily changed. This is clear from the way that a liquid placed on a fluoroplastic plate easily rolls and falls when the plate is tilted. As shown in FIGS. 10A and 10B, with the two structural members, even if the voltage that is applied is the same, then when the position of the liquid changes it is possible that the interval between the structural members and their positional relationships will change. In FIGS. 11A and 11B, numeral 301 is a liquid, numeral 302 is a substrate and numeral 303 is a hydrophilic region. As shown in FIGS. 11A and 11B, if the liquid is touching both the hydrophilic region and the water-repelling region, in terms of energy, then that liquid is more stable in a position in which the hydrophilic region is at its center, as shown in FIG. 11B, than in a position as shown in FIG. 11A. Consequently, in the present position movement mechanism, since one part of the liquid is touching the hydrophilic region, the center of the liquid will always be positioned on this hydrophilic region. As a result, even if an operation is repeated in which a voltage is applied, and is then not applied, between the first electrode and the second electrode, then the position of the center of the liquid is always on the hydrophilic region, and thus the positional relationship between the two structural members can be controlled with favourable reproducibility.

Position Movement Mechanism 4

In a more favorable position movement mechanism of the present invention, the hydrophilic region in position movement mechanism 1 has a concave shape.

Figure 4:
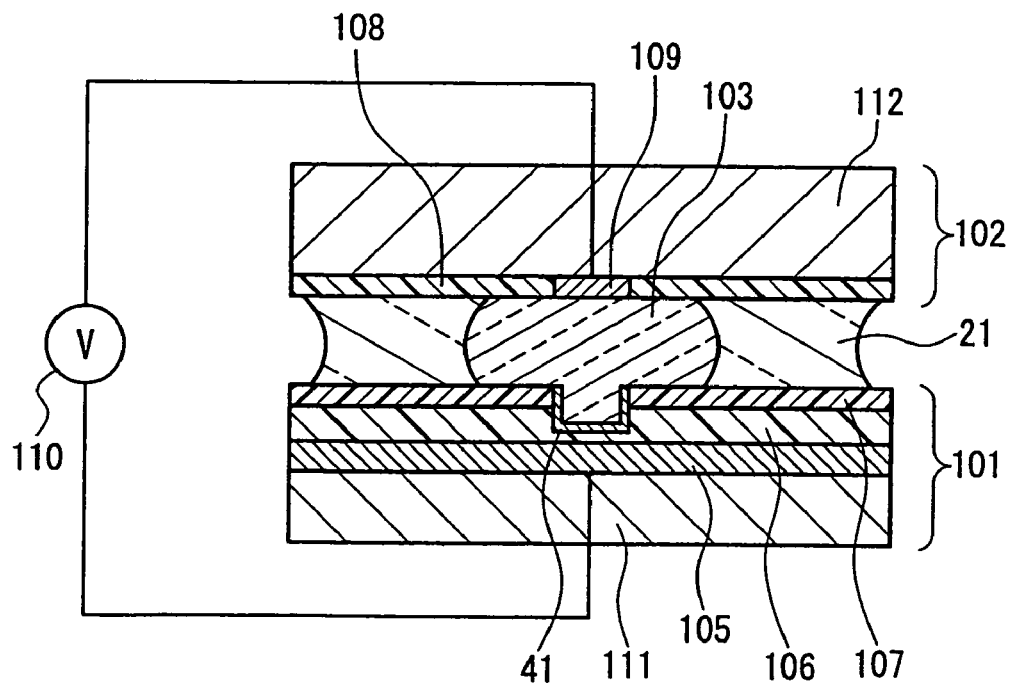
FIG. 4 is a schematic view showing a cross-section of a position movement mechanism of an embodiment of the present invention.

FIG. 4 is a schematic view showing an example of the position movement mechanism of the present invention. If a hydrophilic region 41 has a concave shape, then the contact area between the liquid and the hydrophilic portion is increased, and thus the center of the liquid is more likely to come to rest at the concave portion and the position of the center of the liquid is maintained even with repetition of the position movement operation. Thus, the position of the two structural members can be controlled with favorable reproducibility.

Position Movement Mechanism 5

In an even more favorable position movement mechanism of the present invention, the area of the first electrode on the first structural member is smaller than the area of the water-repelling film, and the liquid is positioned directly above the electrode.

Figure 5:
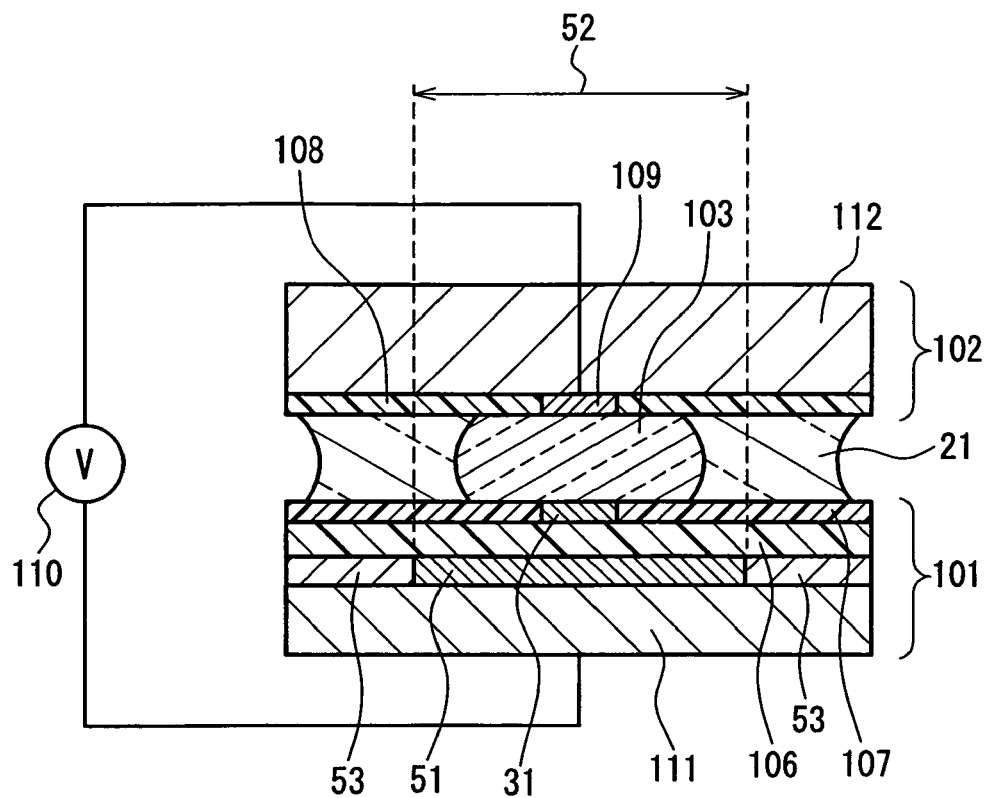
FIG. 5 is a schematic view showing a cross-section of a position movement mechanism of an embodiment of the present invention.

FIG. 5 is a schematic view showing an example of the position movement mechanism of the present invention. When a voltage is applied between the first electrode and the second electrode, the liquid, which is on the water-repelling film of an upper portion of the electrode, spreads due to the electro-wetting effect. However, since the interfacial tension on the water-repelling film, under whose lower portion there is no electrode, does not change, even if the voltage increases the liquid will not spread beyond a range 52 of the electrode. Consequently, it is possible to control the minimum interval between the two structural members accurately. In FIG. 5, numeral 101 denotes the first structural member, numeral 102 denotes the second structural member, numeral 111 denotes a substrate of the first structural member, numeral 112 denotes a substrate of the second structural member, numeral 103 denotes the liquid, numeral 21 denotes the filler liquid, numeral 107 denotes the first water-repelling film, numeral 108 denotes the second water-repelling film, numerals 53 and 106 denote the insulating film, numeral 31 denotes the hydrophilic region, numeral 51 denotes the first electrode, numeral 109 denotes the second electrode and numeral 110 denotes the means for applying a voltage between the first electrode and the second electrode. Numeral 52 denotes an arrow indicating the range within which the electro-wetting effect occurs.

Position Movement Mechanism 6

In a more preferable position movement mechanism of the present invention, at least two liquid bodies are arranged in position movement mechanism 1 to 5.

Figure 6:
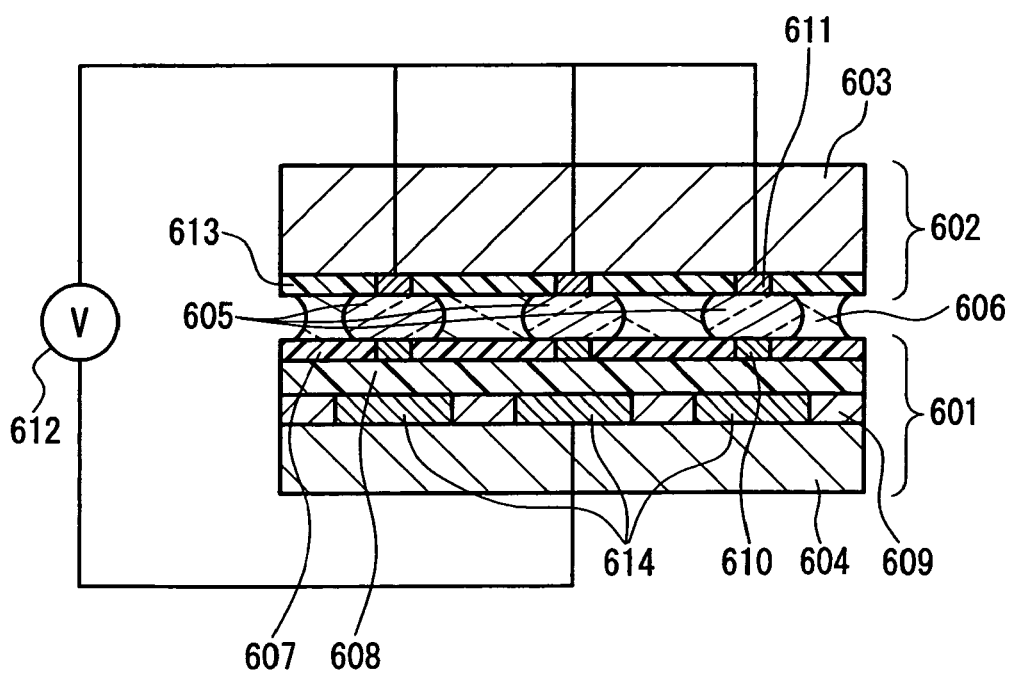
FIG. 6 is a schematic view showing a cross-section of a position movement mechanism of an embodiment of the present invention.

FIG. 6 is a schematic view showing an example of the position movement mechanism of the present invention. Compared with the case in which only a single liquid body is provided, in the present embodiment it is possible to maintain the angle of tilt between the first and second structural members more stably. In FIG. 6, numeral 601 denotes a first structural member, numeral 602 denotes a second structural member, numeral 603 denotes a substrate of the second structural member, numeral 604 denotes a substrate of the first structural member, numeral 605 indicates liquid bodies, numeral 606 denotes a filler liquid, numeral 607 denotes a first water-repelling film, numeral 613 denotes a second water-repelling film, numerals 608 and 609 denote insulating films, numeral 610 indicates hydrophilic regions, numerals 614 indicate first electrodes, numeral 611 indicates second electrodes and numeral 612 denotes means for applying a voltage across the first electrodes and the second electrodes.

Position Movement Mechanism 7

In a more preferable position movement mechanism of the present invention, a position movement mechanism further is provided with means for independently setting the value of a voltage that is applied to each liquid body.

Figure 16:
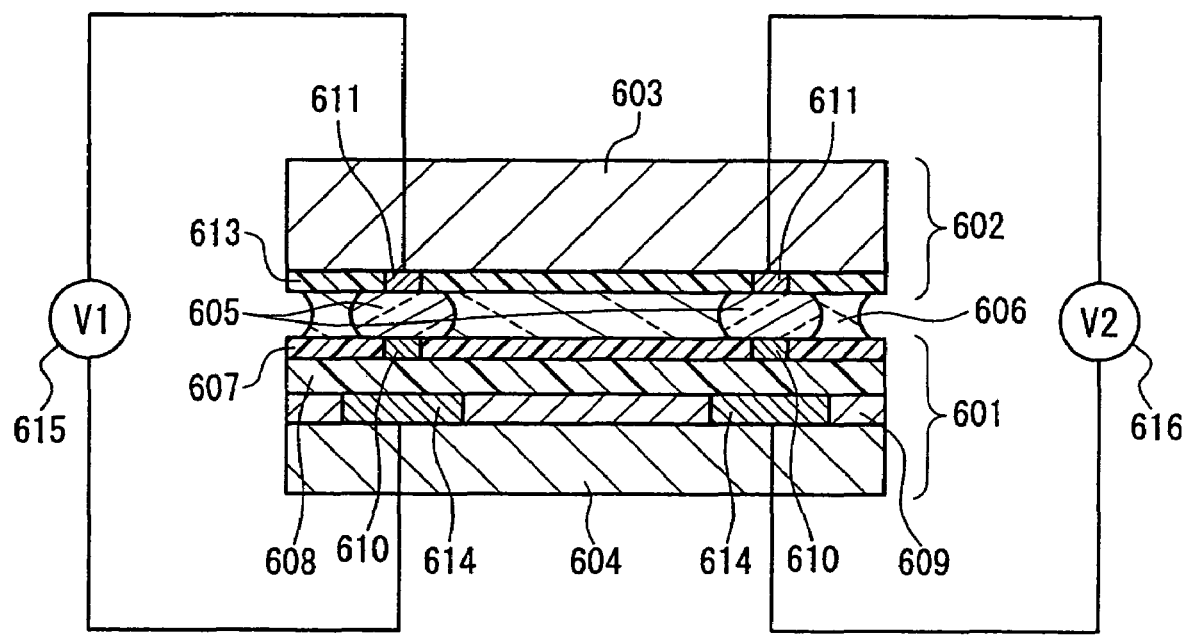
FIG. 16 is a schematic view showing a cross-section of a position movement mechanism according to an embodiment of the present invention.

FIG. 16 is a schematic view showing an example of the position movement mechanism of the present invention. A voltage can be independently applied to each liquid body through voltage application means 1 (615) and voltage application means 2 (616). Thus it is possible to adjust the distance between and the tilt of opposing faces of the first structural member 601 and the second structural member 602. For example, if a voltage is only applied to the liquid body on the left side by the voltage application means 1, then the distance between the first structural member and the second structural member on the left side of the drawing narrows, and thus the tilt of both structural members changes. FIG. 16 shows a case in which two liquid bodies are arranged, however if liquid bodies are added to the back and the front with respect to the surface of the paper, then it is possible to freely change the angle of the opposing faces of the first structural member and the second structural member.

Furthermore, the distance between the imaging element and the lens of the miniature camera of the present invention is adjusted by the position movement mechanism of movement mechanisms 1 to 7.

Furthermore, the tilt of the face of a goniometer of the present invention can be adjusted by movement mechanisms 1 to 7.

Furthermore, a fiberscope of the present invention is provided with a miniature camera on one end of a fiber, wherein the structure is such that an image signal taken here is conducted to the other end of the fiber, and wherein the direction of the lens of the miniature camera is adjusted by a goniometer using the movement mechanisms 1 to 7.

Embodiments of the present invention are described in the following in order to facilitate understanding of the present invention, however the present invention is not limited to only the embodiments cited herein.

Embodiment 1

Figure 12:
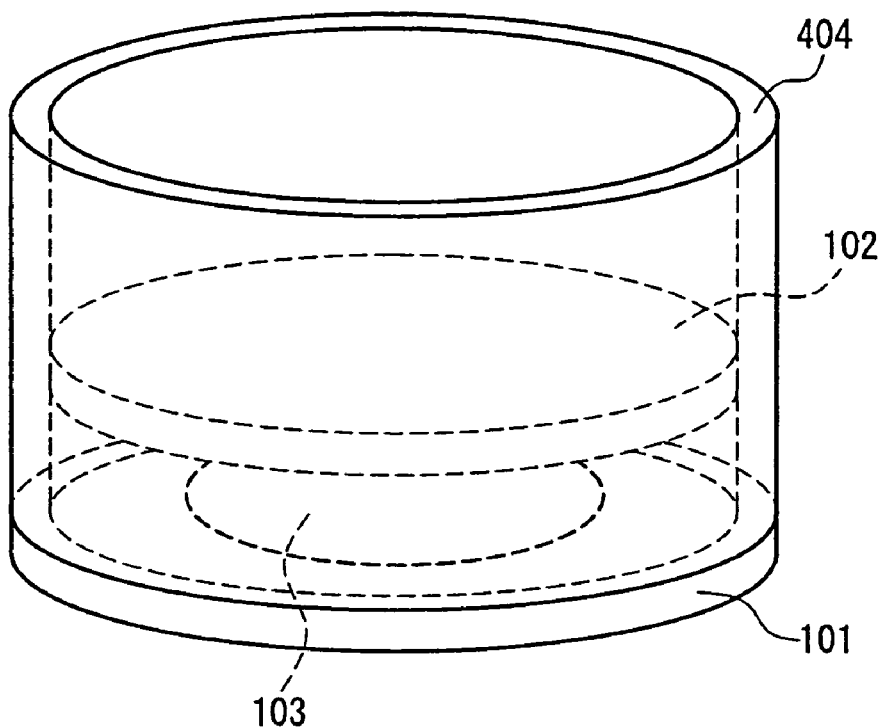
FIG. 12 is a schematic view showing a position movement mechanism according to an embodiment of the present invention.

FIG. 12 is a schematic view showing a position movement mechanism of the present invention. A cross-sectional view of the vicinity of the first structural member 101, the liquid 103 and the second structural member 102 are shown in FIG. 1. In the present embodiment, the first structural member is one part of a bottom face of a fixed tube 404. The second structural member 102 is arranged such that it can move in the vertical direction within the tube. In the picture, gravity acts in the downward direction. Consequently, in the diagram, gravity is the binding force that acts on the second structural member 104.

The fixed tube 404 has a shape whose internal diameter is 10 mm and whose height is 30 mm, and its material is polycarbonate resin. The first structural member 101 is made from a silicon substrate 111 that has a thickness of 100 µm (see FIG. 1. In FIG. 12, this is included as a part of the first structural member 101), a platinum electrode 105 that has a thickness of 100 nm (the first electrode in FIG. 1), a lead zirconate titanate film 106 whose thickness is 100 nm (referred to below as PZT, this is the insulating film in FIG. 1) and a water-repelling film 107 whose thickness is on the order of 1 nm (the first water-repelling film in FIG. 1), and these are fixed to the fixed tube 404. Furthermore, the second structural member 102 is a disk-shaped piece of polycarbonate of a thickness of 100 µm, wherein a platinum electrode 109 (the second electrode in FIG. 1) having a diameter of 1 mm is formed in its center, and a second water-repelling film 108 is formed that is the same as the first water-repelling film around the platinum electrode. 600 µL of a 1 mMol aqueous solution of KCl (the liquid in FIG. 1) is inserted into the gap between the first structural member and the second structural member. The solution is positioned in the center of the second structural member and is in contact with the second electrode. The first electrode and the second electrode are arranged such that a DC voltage can be applied to them. In the position movement mechanism of the present embodiment the second structural member is designed so as to move 500 µm closer to the first structural member, through the application of 5V DC.

The following describes a manufacturing method of the first structural member and the second structural member.

(1) Manufacturing Method of the First Structural Member

The first electrode was formed by vacuum sputtering onto the silicon substrate, continuing after which the PZT was formed by vacuum sputtering. UV light was irradiated for 10 minutes onto the PZT surface in an ozone atmosphere at 110° C. After this, the substrate was dipped into a 1 vol % solution of $CF_3(CF_2)_7C_2H_4SiCl_3$ in mixtures of n-hexadecane and chloroform (4:1 by volume) for three hours, after which the substrate was washed with chloroform. Dipping and washing was carried out under a nitrogen atmosphere. After this, the substrate was washed with water. As a result, a water-repelling monomolecular film that has a thickness of 1 nm was formed on the PZT.

(2) Manufacturing Method of the Second Structural Member

The second electrode is fabricated on the disk shaped polycarbonate substrate, which has a thickness of 100 µm, by vacuum sputtering using a metal mask. After this, the substrate surface on which the electrodes are formed was irradiated for 10 minutes by UV light under an ozone atmosphere at room temperature. After this, the substrate was dipped for three hours in a 1 vol % solution of $CF_3(CF_2)_7C_2H_4SiCl_3$ in n-perfluorooctane solvent, after which the substrate was washed in n-perfluorooctane. Dipping and washing was carried out in a nitrogen atmosphere. After this, the substrate was washed with water. Next, a metal mask was attached in close proximity to the face of the substrate on which the electrodes are formed, and the water-repelling monomolecular film on the electrodes was removed from the electrode portions only, by irradiating with oxygen plasma. As a result, a second structural member, on which, in addition to the second electrode, a water-repelling monomolecular film that has a thickness not more than 1 nm is formed, could be fabricated.

As for the liquid bodies, when the 1 mMol aqueous solution of KCl was used, the static angle of contact θ with respect to the second water-repelling film was 120°.

The thin PZT film used in the present embodiment has a dielectric constant that is high at 700, and thus the capacitor capacitance C in equation (3) can be increased, allowing a large electro-wetting effect even with application of a low voltage. Moreover, since the film thickness of the monomolecular film used in the present embodiment is low at not more than 1 nm, the capacitance C in equation (3) can increase, and a large electro-wetting effect can be achieved even at low application voltage. Furthermore, since the monomolecular film of the present invention has siloxane bonds (Si—O) with the PZT surface, there is no delamination of the film, and it is possible to realize a highly durable position movement mechanism.

It should be noted that PZT was used as the insulating film in the present embodiment, however it is not necessary that it be limited to this. As for the insulating film that is used, in order to increase the capacity C in equation (3), a ferroelectric material with a large dielectric constant is preferred. For a ferro-electric material, PZT can be dosed with additives such as magnesium, manganese, cobalt, iron, nickel, niobium, scandium, tantalum and bismuth. A bariumate strontiumate titanate compound is also suitable.

Furthermore, there is no necessity that the water-repelling film be limited to a monomolecular film, and it is also possible to use a fluoroplastic such as polytetrafluoroethylene. Furthermore, it is also possible to form a water-repelling film by coating with a mixed solution of $CF_3(CF_2)_7C_2H_4Si(OCH_3)_3$, alcohol, water and an acidic solvent. Furthermore, it also possible to form a water-repelling film by coating a mixed solution of $Si(OC_2H_5)_4$, $CF_3(CF_2)_7C_2H_4Si(OCH_3)_3$, alcohol, water and an acidic solvent, and then calcining.

Furthermore, in the present embodiment, a 1 mMol aqueous solution of KCl was used as the liquid, however there is no limitation to this, and other aqueous solutions, organic solvents, or mixture of aqueous solutions and organic solvents can be used. Particularly, in order to greatly change the interfacial tension between the liquid and the insulating film at low voltage, it is necessary to generate most of the electric charge at the interface between the liquid and the insulating film, and thus it is preferable to use a liquid that is an electrolyte.

For the aqueous electrolyte, there are for example, buffer solutions that contain a variety of salts, such as NaCl aqueous solution, NaBr aqueous solution and $NH_4Cl$ aqueous solution. If the electrolyte that is used is an organic solvent, then non-aqueous acetic acid, methanol, tetrahydrofuran, propylene carbonate, nitromethane, acetonitrile, dimethylformamide, dimethylsulfoxide and hexamethylphosphoamide can be used as the solvent medium, and $NaClO_4$, $LiClO_4$, KOH, $KOCH_3$, $NaOCH_3$, LiCl, $NH_4Cl$, $n\text{-}(CH_3C_3H_6)_4Ni$, $Mg(ClO_4)_2$ and $NaBF_4$, for example, can be used as the electrolyte. Furthermore, alcohol-based solvents, various esters, aliphatic hydrocarbons, alicyclic hydrocarbons, aromatic hydrocarbons, halogenated hydrocarbons and various other oils and the like that include trace amounts of aqueous electrolyte solution also can be used. It is preferable that the amount of salt or electrolyte present is in the range of at least $10^{-4}$ mass % and at most 30 mass %.

Embodiment 2

Figure 13:
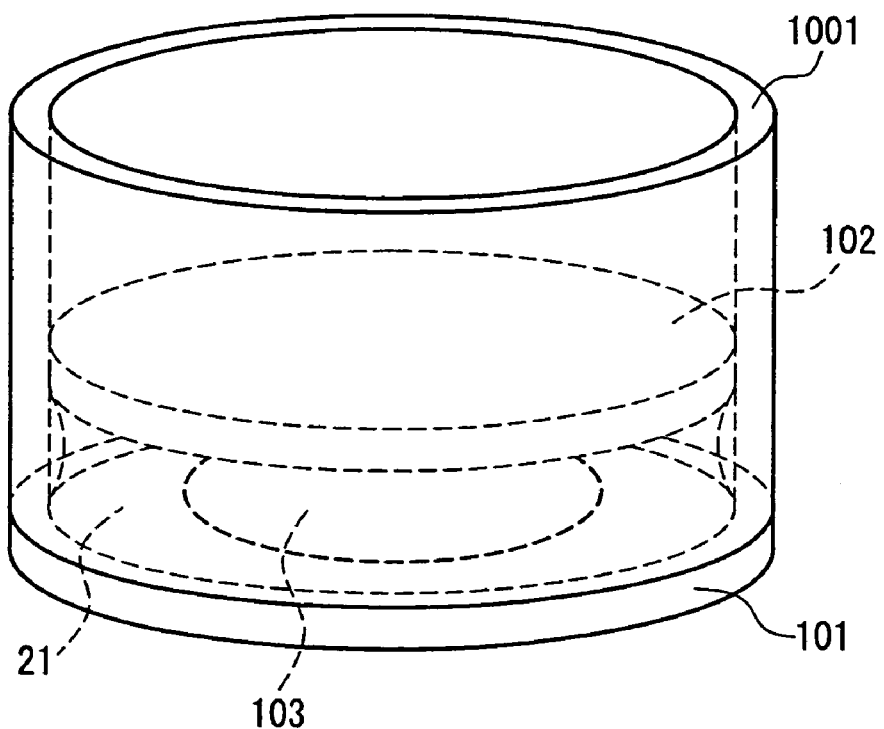
FIG. 13 is a schematic view showing a position movement mechanism according to an embodiment of the present invention.

FIG. 13 is a schematic view showing a position movement mechanism of the present invention. FIG. 2 is a cross-sectional view of the vicinity of the first structural member 101, the liquid 103 and the second structural member 102. The basic structure of the present invention is the same as in Embodiment 1, however a filler liquid 21 has been added. Numeral 1001 is a fixed tube. In the present embodiment, a modified organic silicone oil (phenylmethylsiloxane homopolymer, manufactured by Gelest) with a specific gravity of 1.0 and a viscosity of 10 cPs is used as the filler liquid. The amount of filler liquid is adjusted such that the liquid 103 is completely enclosed within it, that no air bubbles are contained within it, and moreover, that it does not protrude from the gap between the first structural member and the second structural member. The surface tension of the filler liquid is on the order of 30 dyne/cm, and at the time of filling, the liquid surface has a concave shape. Thus, the filler liquid is under less pressure than the external pressure, and the first structural member and the second structural member are under tension. This tensional force is the force that binds the first structural member and the second structural member.

If the binding force is gravity, then when the fixed tube is tilted or turned upside down, for example, the liquid that is sandwiched between the two structural members moves away from both structural members and the present invention will not operate as a position movement mechanism. However if the binding force is provided by the surface tension of the filler liquid, then even if the fixed tube is tilted in any way, the filler liquid is still in contact with both structural members and the present invention can be operated as a position movement mechanism.

In the present embodiment, a silicone oil whose specific gravity is close to water was used as the filler liquid, and thus there is no shift in the position of the liquid 103 caused by buoyancy.

It should be noted that it is not necessary that the filler liquid is limited to silicone oil, and it is also possible to use a fluorine-based oil for example. If the liquid 103 is an aqueous solution, fluorine-based oils have even less affinity for water than silicone does, and thus the liquid will not dissolve into the filler liquid even over a long time, and it is possible to realize a position movement mechanism that is capable of enduring long time use.

Embodiment 3

A position movement mechanism similar to that in Embodiment 2 was formed. However, a hydrophilic region exists on the insulating film of the first structural element wherein the water-repelling film is not formed, and the liquid is in contact with the hydrophilic region. A cross-sectional view of the vicinity of the first structural member, the liquid and the second structural member of the present embodiment is shown in FIG. 3. A circular hydrophilic region 31 with a diameter of 1 mm is formed in the center of the first structural member 101. After formation of the water-repelling film, the hydrophilic region is formed by affixing a metal mask that has circular holes of a diameter of 1 mm to the water-repelling film, and irradiating the metal mask with oxygen plasma. That is to say, the oxygen plasma only hits the water-repelling film in the part of the open holes, removing the water-repelling film, and the PZT is hydrophilically converted at the same time.

Because the liquid is in contact with the hydrophilic region, the liquid does not shift from the position that has the hydrophilic region at its center, and thus there is no offset in the positional relationship between the first structural member and the second structural member.

Embodiment 4

A position movement mechanism similar to that of Embodiment 3 was fabricated. However, the hydrophilic region is arranged as a concave shape. FIG. 4 shows a cross-sectional view of the vicinity of the first structural member, the liquid, and the second structural member. A hydrophilic region 41 is a concave portion, whose shape is a circle in the bottom face of the first structural member, whose diameter is 1 mm, and whose depth is 80 nm. Before forming the water-repelling film, a hole is opened for the concave portion in the PZT film by photolithography. A mixed solution of hydrofluoric acid and nitric acid is used for the etching fluid of the PZT film. After this, as in Embodiment 3, the water-repelling film is formed, after which the water-repelling film of only the concave portion is removed by oxygen plasma treatment.

Compared to the case in which the hydrophilic region is flat, in the present embodiment the liquid has a larger contact area and it is difficult for the liquid to become removed from the hydrophilic region. Consequently, even with repetition of the position movement operation, the center position of the liquid is always on the hydrophilic region without shifting, and it is possible to maintain the positional relationship between the first structural member and the second structural member accurately.

Embodiment 5

A position movement mechanism similar to that in Embodiment 3 was fabricated. However, in the first structural member, the area of the first electrode is smaller than the area of the water-repelling film, and the liquid is positioned so that it is directly above the electrode. A cross-sectional view of the vicinity of the first structural member, the liquid and the second structural member is shown in FIG. 5.

The shape of a first electrode 51 is circular, with a diameter of 5 mm. There is a hydrophilic region 31 in its center. The liquid that is on the water-repelling film that is above the electrode portion between the first electrode and the second electrode spreads due to the electro-wetting effect when a voltage is applied. However, the surface tension of the liquid on the water-repelling film under which there is no electrode does not change, and thus the liquid does not spread beyond the range 52 of the electrode, however high an applied voltage is. Consequently, it is possible to control the minimum interval between the two structural members accurately.

Embodiment 6

Figure 14A:
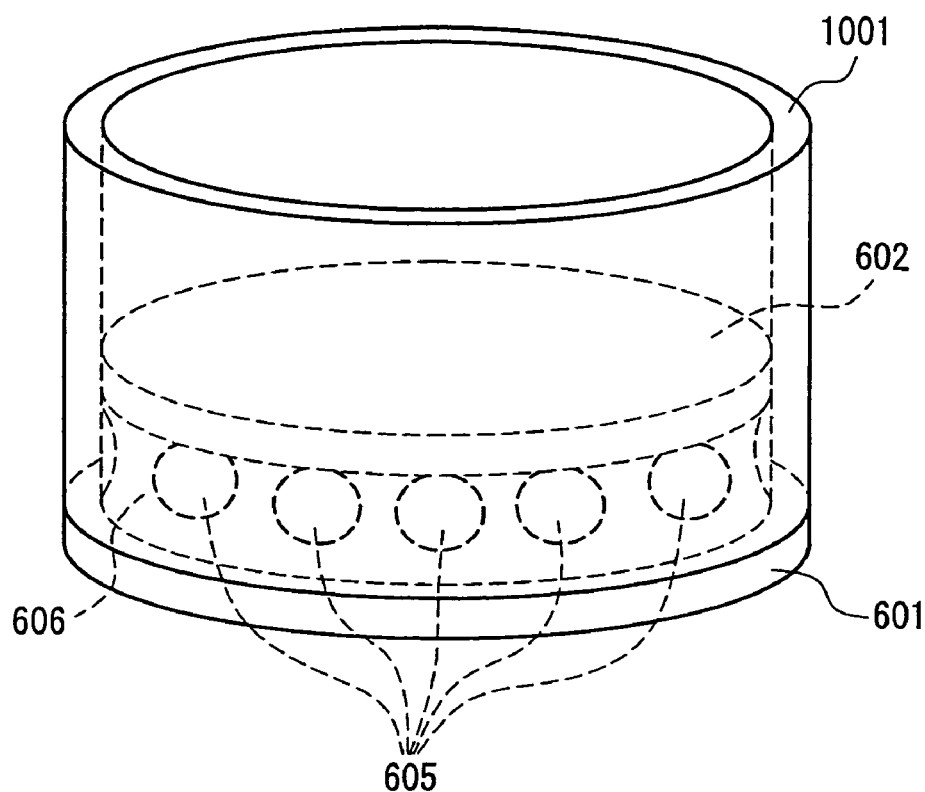
Figure 14B:
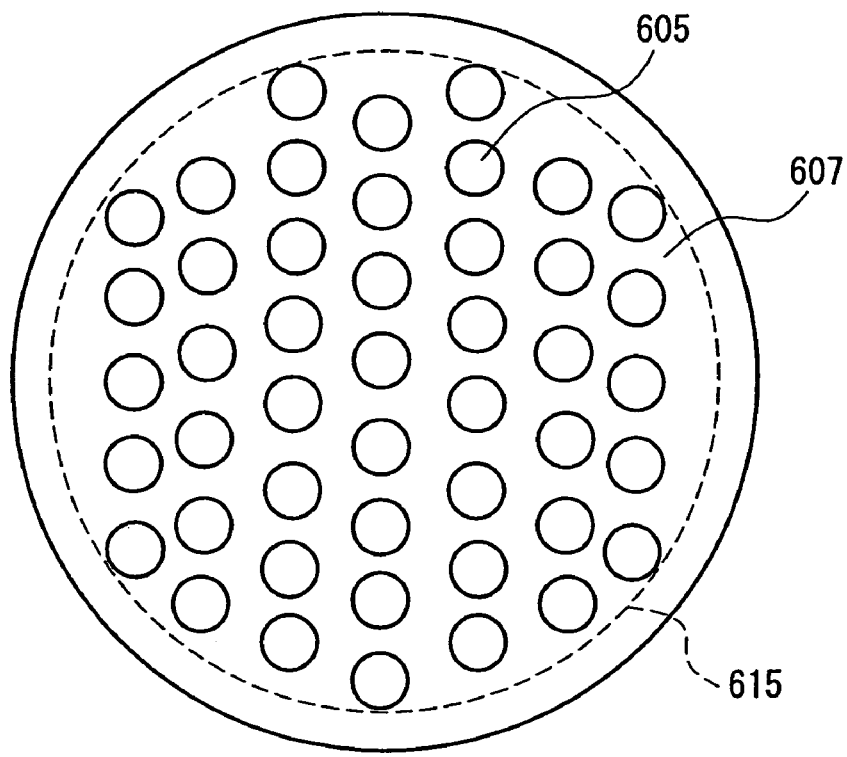
FIG. 14B shows a plan view of a first structural member, seen from above, and the arrangement of liquid bodies.

FIG. 14A schematically shows the present embodiment. FIG. 14B is a plan view of the first structural member 601 seen from above, and it schematically shows the arrangement of the liquid bodies 605 on the first water-repelling film 607. FIG. 6 is a cross-sectional view of the vicinity of the first structural member, the liquid bodies and the second structural member. The basic structure of the present invention is the same as that of Embodiment 5, however it differs in the arrangement of a plurality of liquid bodies 605. When a multitude of liquid bodies is used, such as in the present embodiment, it is possible to maintain the tilt angle of the two structural members with greater reliability than when there is only a single liquid body.

A plurality of liquid bodies 605 of a volume of 0.5 µL are arranged on the first water-repelling film such that the centers of the liquid bodies are at 2 mm intervals. However, the liquid bodies are arranged within the circle area whose periphery is smaller than that of the first structural member by 2 mm (within a dotted line 615 in the diagram). It should be noted that the contact region between the disposed liquid bodies and the first water-repelling film is a region within a 0.2 mm diameter circle when in the state in which a voltage is not applied. Furthermore, as shown in FIG. 6, hydrophilic regions are provided at portions 610, which are at the center of the liquid bodies. The hydrophilic regions are provided as circular regions with a diameter of 50 µm. Furthermore, circular first electrodes 614 are formed below each hydrophilic region. Furthermore, second electrodes 611 of the second structural member 602 are provided so as to be positioned directly above the first electrodes 614, and their shape is set to be circular with a diameter of 50 µm.

The present position movement mechanism is designed such that when a voltage of 5V DC is applied between the first electrode and the second electrode, the interval between the first structural member and the second structural member decreases by 100 µm.

Embodiment 7

Figure 15:
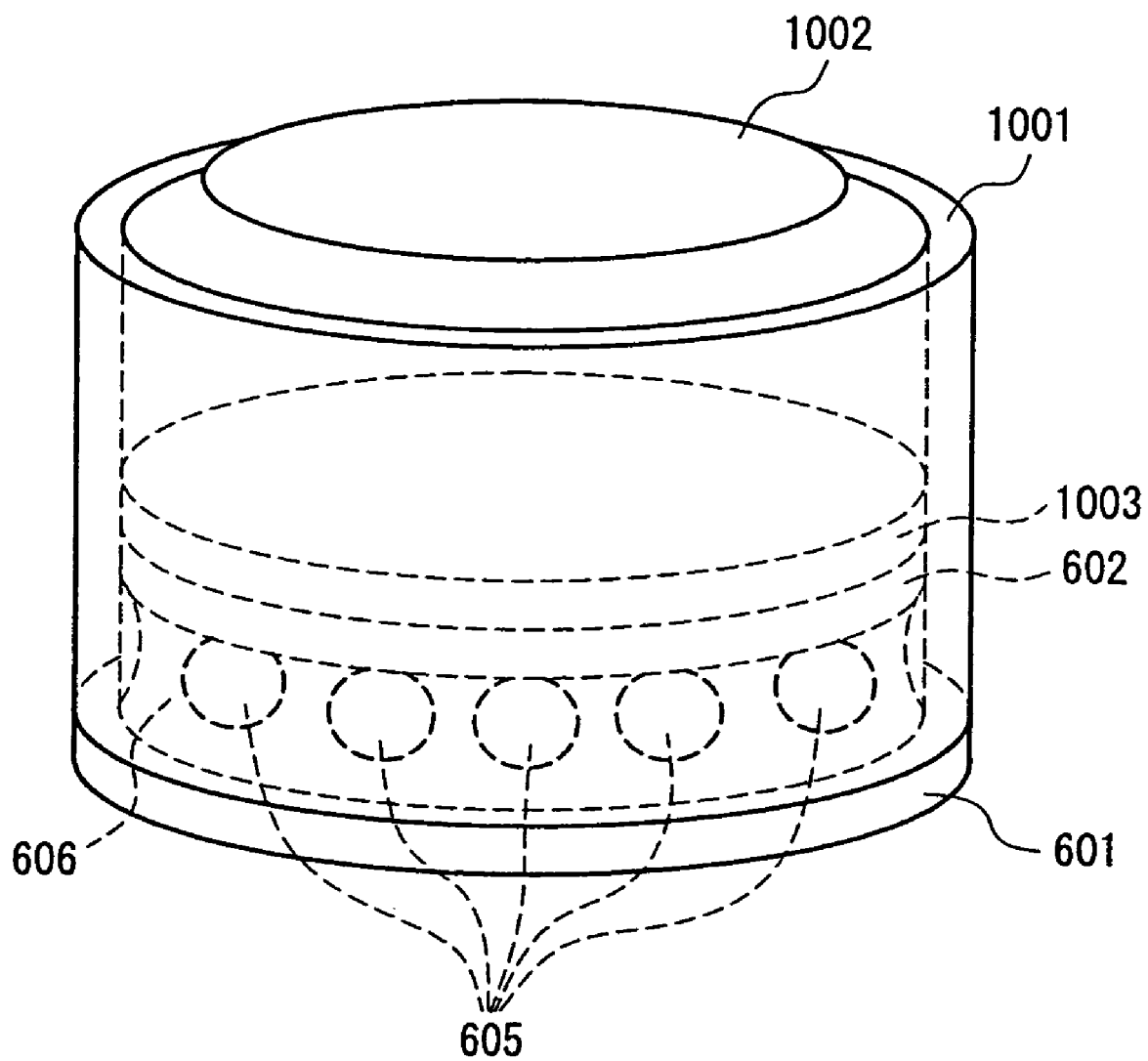
FIG. 15 is a schematic view of a camera of an embodiment of the present invention.

A schematic view of a miniature camera of the present embodiment is shown in FIG. 15. An imaging element 1003 is fixed to the second structural element 602 of the position movement mechanism shown in Embodiment 6. An objective lens 1002 is provided in an upper portion of the imaging element. The object to be photographed is imaged onto the imaging element 1003 through the objective lens. The image is focused by adjusting the distance between the imaging element 1003 and the objective lens 1002 through vertical movement of the second structural element. As with Embodiment 6, the interval between the first structural element and the second structural element can be moved 100 µm when a DC 5V voltage is applied between the first electrode and the second electrode.

Embodiment 8

For a goniometer of the present embodiment, a mechanism is provided to control independently the voltage that is applied to each liquid body in Embodiment 6. The basic structure is the same as that in FIG. 14, but a mechanism is provided for independently applying a voltage to each liquid body. Furthermore, the outside diameter of the second structural member is designed to be 1 mm smaller than the inside diameter of the fixed tube, and thus the second structural member can freely tilt within the tube.

Embodiment 9

Figures 17A, 17B:
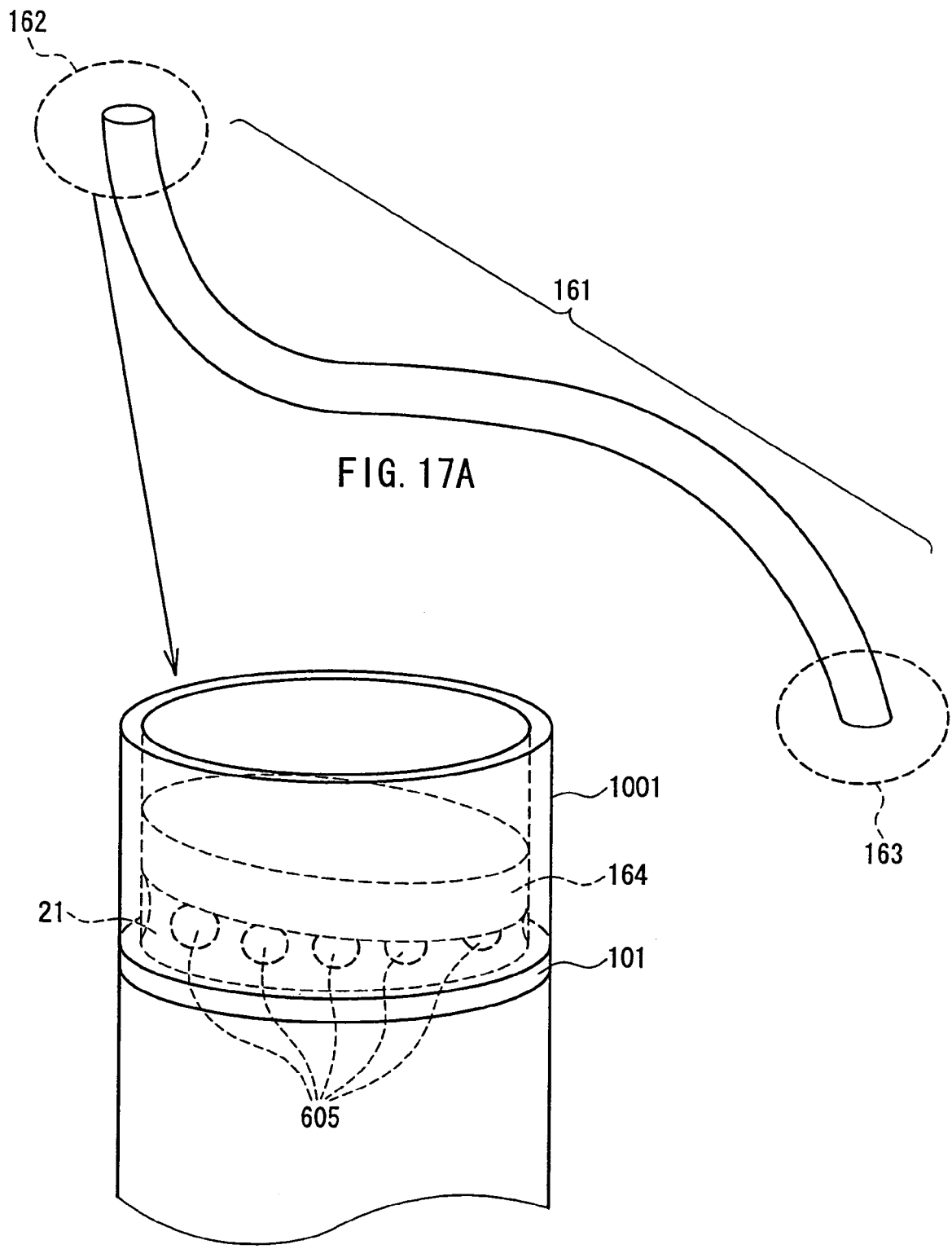
FIG. 17A is an overview of an entire fiberscope according to an embodiment of the present invention, and similarly
FIG. 17B is an enlarged schematic view of a fiber terminal portion in which a miniature camera is installed.

An overview of an entire fiberscope of the present embodiment is shown in FIG. 17A. For the fiberscope of the present invention, a miniature camera is attached to one end 162 of a long, thin-tube-shaped, flexible fiberscope 161, and a mechanism is provided at another end 163 (capturing mechanism is not illustrated) for capturing the image information that is photographed by the miniature camera and passed through the fiber. FIG. 17B is an enlargement of the part of the fiberscope end 162, on which the miniature camera is provided. The basic structure of this part is the same as in Embodiment 8, however it differs in that a miniature camera in which the imaging element and the lens is provided is fixed to a second structural member 164 (details of the structure of the camera are not shown in the diagram). A lens with a deep focal point is used in the present camera to obviate the need for focusing. Thus, the image quality of the object that is photographed by the present camera is worse than that in Embodiment 7, however it adequately satisfies the needs accorded by the object that is photographed and the purpose of the photography. As shown in FIG. 17B, in the present camera, the tilt of the second structural member 164 can be freely adjusted by independently applying a voltage to each liquid body 605, and thus it is possible to direct the camera toward the position of the object to be photographed. Numeral 21 denotes the filler liquid, numeral 101 denotes the first structural member and numeral 1001 denotes the fixed tube.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

INDUSTRIAL APPLICABILITY

If the position movement mechanism of the present invention is used, then the mechanism can be both easily miniaturized, and its position can be moved with low voltage, and thus it also can be utilized as a position movement mechanism for micro-machines for medical treatment. For example, it can also be utilized for such surgical actuators that are mounted on the tip of gastro-cameras and intestinal cameras.

What is claimed is:

1. A movement mechanism, comprising:
   a first structural member;
   a second structural member spaced from the first structural member; and
   a liquid between the first structural member and the second structural member,
   wherein the first structural member and the second structural member both contact the liquid;
   wherein a face of the first structural member on the side that is in contact with the liquid includes a first electrode, an insulating film formed on the first electrode and a first water-repelling film formed on the insulating film;
   wherein a face of the second structural member on the side that is in contact with the liquid includes a second electrode and a second water-repelling film is formed on the periphery of the second electrode;
   wherein the liquid is in contact with both the second electrode and the second water-repelling film;
   wherein the face of the first structural member on the side that is in contact with the liquid and the face of the second structural member that is in contact with the liquid are opposed to each other;
   wherein the movement mechanism comprises means for applying a voltage between the first electrode and the second electrode; and
   wherein the liquid is arranged in at least two locations.

2. The movement mechanism according to claim 1, wherein a static contact angle θ of the liquid with respect to the second water-repelling film, is greater than 90°.

3. The movement mechanism according to claim 1, wherein a filler liquid, which does not mix with the liquid, is filled between the first structural member and the second structural member, and
   wherein the shape of the part of the liquid surface of the filler liquid that is not in contact with the first structural member, the second structural member and the liquid, is concave-shaped.

4. The movement mechanism according to claim 1, further comprising:
   a hydrophilic region in which the water-repelling film is not formed, provided on the insulating member of the first structural member
   wherein the liquid is in contact with the hydrophilic region.

5. The movement mechanism according to claim 1, wherein, in the first structural member, the area of the first electrode is smaller than the area of the water-repelling film, and the liquid is positioned in a position that is directly above the electrode.

6. The movement mechanism according to claim 1, further comprising:
   means for independently setting the value of the voltage that is applied to the liquid, for the different locations.

7. A movement mechanism, comprising:
   a first structural member;
   a second structural member spaced from the first structural member; and
   a liquid between the first structural member and the second structural member,
   wherein the first structural member and the second structural member both contact the liquid;
   wherein a face of the first structural member on the side that is in contact with the liquid includes a first electrode, an insulating film formed on the first electrode and a first water-repelling film formed on the insulating film;
   wherein a face of the second structural member on the side that is in contact with the liquid includes a second electrode, and a second water-repelling film is formed on the periphery of the second electrode;
   wherein the liquid is in contact with both the second electrode and the second water-repelling film;
   wherein the movement mechanism comprises means for applying a voltage between the first electrode and the second electrode; and
   wherein the liquid is arranged in at least two locations.

8. The movement mechanism according to claim 7, further comprising: means for independently setting the value of the voltage that is applied to the liquid, for different locations.

* * * * *